United States Patent [19]
Sutton

[11] Patent Number: 5,815,370
[45] Date of Patent: Sep. 29, 1998

[54] FLUIDIC FEEDBACK-CONTROLLED LIQUID COOLING MODULE

[76] Inventor: Trevor G. Sutton, 5616 S. Pirates Cove, Tempe, Ariz. 85283

[21] Appl. No.: 857,260

[22] Filed: May 16, 1997

[51] Int. Cl.[6] ...................................................... H05K 7/20
[52] U.S. Cl. ............................ 361/699; 361/689; 361/704; 361/717; 361/718; 257/714; 257/716; 174/15.1; 174/16.1; 174/16.3; 165/80.4
[58] Field of Search ................................... 361/699, 689, 361/698, 701, 702, 704, 711, 717, 718, 719; 257/714, 716; 174/15.1, 16.1, 16.3; 165/80.2, 80.4, 104.33; 137/808, 810, 812

[56] References Cited

U.S. PATENT DOCUMENTS

| | | |
|---|---|---|
| 3,999,105 | 12/1976 | Archey et al. . |
| 5,050,037 | 9/1991 | Yamamoto et al. . |
| 5,190,099 | 3/1993 | Mon ................................. 165/104.33 |
| 5,469,331 | 11/1995 | Conway et al. . |
| 5,550,436 | 8/1996 | Kesel . |

OTHER PUBLICATIONS

AiResearch Final Report 76–411546 dated Oct. 19, 1976, "Program to Design, Fabricate, Test, and Deliver a Thermal Control–Mixing Control Device for George C. Marshall Space Flight Center National Aeronautics & Space Administration (Contract No. NAS3–31289)".

*Primary Examiner*—Gerald P. Tolin
*Assistant Examiner*—Boris L. Chervinsky
*Attorney, Agent, or Firm*—Jerry J Holden

[57] ABSTRACT

A liquid cooling module for cooling electronic circuit components and the like comprises the use of a fluidic amplifier element in conjunction with a thermally sensitive fluidic element. The thermally sensitive fluidic element responds to the change in viscosity with respect to temperature of a coolant flowing through a cooling plate. In response to the viscosity change, the thermally sensitive element produces a fluidic control signal to the fluidic amplifier element, which increases the rate of flow through the cooling plate with increasing coolant temperature and decreases the rate of flow through the cooling plate with decreasing coolant temperature.

10 Claims, 5 Drawing Sheets

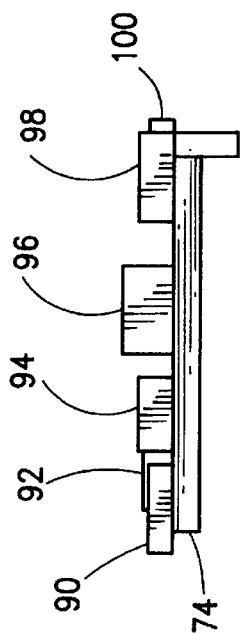
FIG. 9
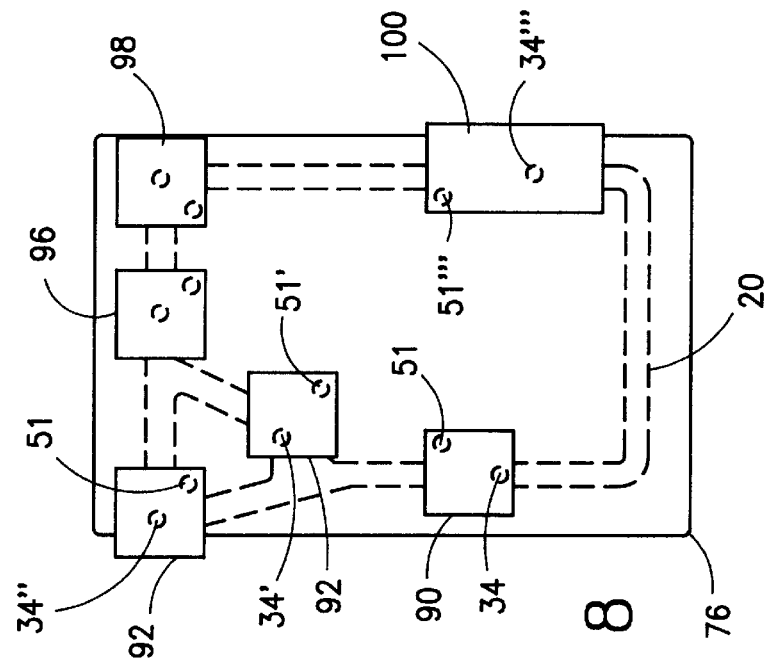
FIG. 8   FIG. 7
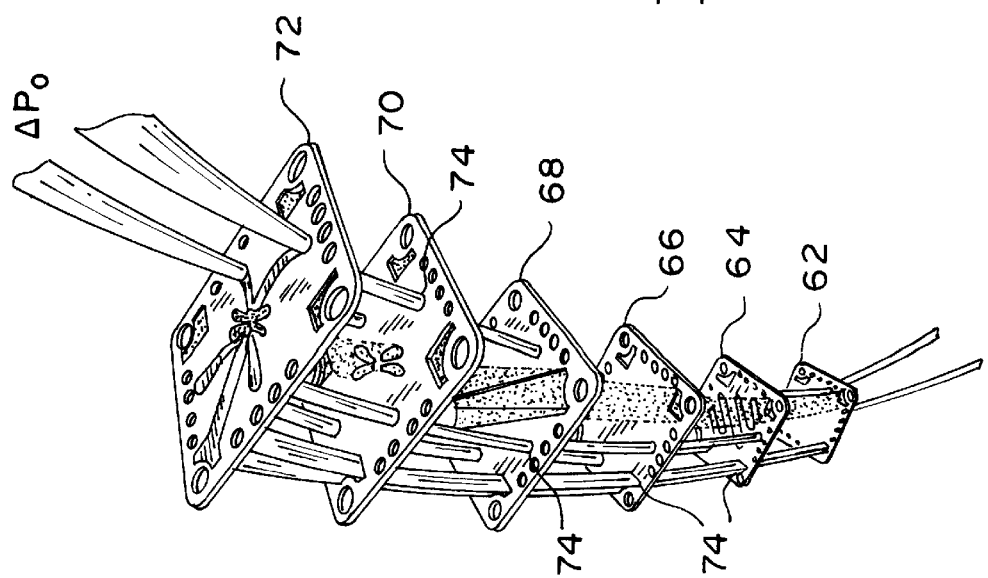

FLUIDIC FEEDBACK-CONTROLLED LIQUID COOLING MODULE

TECHNICAL FIELD

The present invention relates to a liquid cooling system for electronic circuit components or other heat sources requiring active thermal management.

BACKGROUND OF THE INVENTION

Cooling requirements for electronic circuits are generally met by the use of heat sinks that are directly attached to the high energy use components. Heat generated by the high energy use component is conducted directly to the heat sink, which dissipates the heat through conduction, convection and/or radiation. In certain applications, particularly where the component density is high, a liquid coolant, such as FREON 22, ammonia, or Monsanto coolant may be circulated through internal passages within the heat sink (hereinafter referred to as a cooling plate) to remove the excess heat. The temperature of any particular component within the system is therefore controlled by a combination of the thermal mass of the cooling plate itself and the rate of coolant flow through the cooling plate. Ordinarily, to support the peak load at any component within the system, liquid cooling systems must be designed with either excess coolant capacity and/or excessively large cooling plates, with commensurate increase in cost and weight of the system. The increase in weight of such systems is particularly disadvantageous in satellite and other space applications.

A liquid cooling system, as described above, could be optimized around the average load, rather than the peak load, if it were possible at any time to distribute the coolant to the peak thermal load point while reducing flow to the minimum load points. The optimization of this thermal loading would maintain a flow capability for the average load case while providing an integrated thermal management system to divert flow to the hot spots and away from the cold spots. Although such a thermal management system could be implemented using temperature sensors, valves and the like, the high cost, weight, and low reliability of such a complex system would undoubtedly outweigh the benefits achieved. Such a thermal management system would ideally be implemented with few (or no) moving parts.

SUMMARY OF THE INVENTION

The present invention achieves the desired goal of an active thermal management system with no moving parts, by controlling the flow of liquid coolant using integrated fluidic control elements. The invention comprises the use of a fluidic amplifier element in conjunction with a thermally sensitive fluidic element. The thermally sensitive fluidic element responds to the change in viscosity with respect to temperature of the coolant flowing through a cooling plate. In response to the viscosity change, the thermally sensitive element produces a fluidic control signal to the fluidic amplifier element, which increases the rate of flow through the cooling plate with increasing coolant temperature and decreases the rate of flow through the cooling plate with decreasing coolant temperature.

One embodiment incorporating features of the invention comprises a plurality of cooling plates in fluid communication with a common source of pressurized coolant. Each individual cooling plate has the volume of flow through the cooling passages modulated to maintain a fixed outflow temperature irrespective of instantaneous thermal load. The thermally sensitive fluidic element may comprise a fluidic vortex sensor having a physical configuration similar to a fluidic vortex diode and the fluidic amplifier element may comprise a fluidic vortex amplifier.

BRIEF DESCRIPTION OF THE DRAWINGS

The present invention will be better understood from a reading of the following detailed description, taken in conjunction with the accompanying drawing figures in which like references designate like elements and, in which:

FIG. 7 is a top plan view of a laminated fluidic module incorporating features of the present invention; and FIG. 8 is a side view of the laminated module of FIG. 7.

DESCRIPTION OF THE PREFERRED EMBODIMENT

Figure 1:
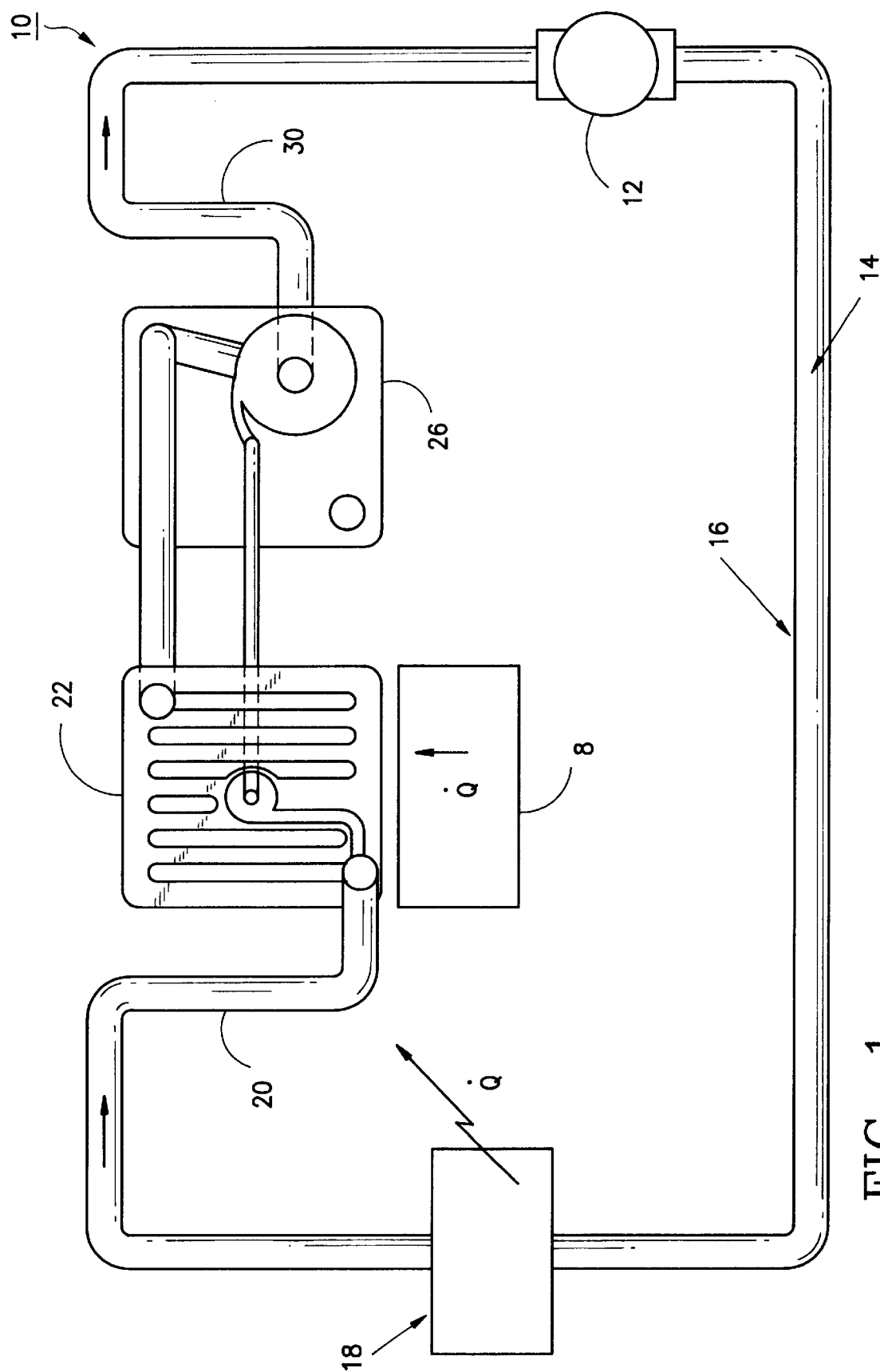
FIG. 1 is a schematic of a thermally managed liquid cooling module incorporating features of the present invention.

FIG. 1 shows a liquid cooling module generally denoted by reference numeral 10 having a pump 12 which circulates a liquid coolant 14, through a closed loop passage 16. Coolant 14 may be FREON 22, ammonia, Monsanto coolant or other liquid coolant suitable for cooling electronics or other heat-producing components. The coolant 14 flows from pump 12 through a heat exchanger or other heat rejection means 18 into a distribution manifold 20, and thereafter into a cooling plate 22, which is in contact with, and conducts heat away from heat-producing electronic component 8. Coolant flowing through cooling plate 22 is regulated by flow regulator 26, which is in-line with the flow discharged from cooling plate 22. Coolant discharged from flow regulator 26 is collected in collection manifold 30 and returned to pump 12 to complete the closed-loop path.

Figure 2:
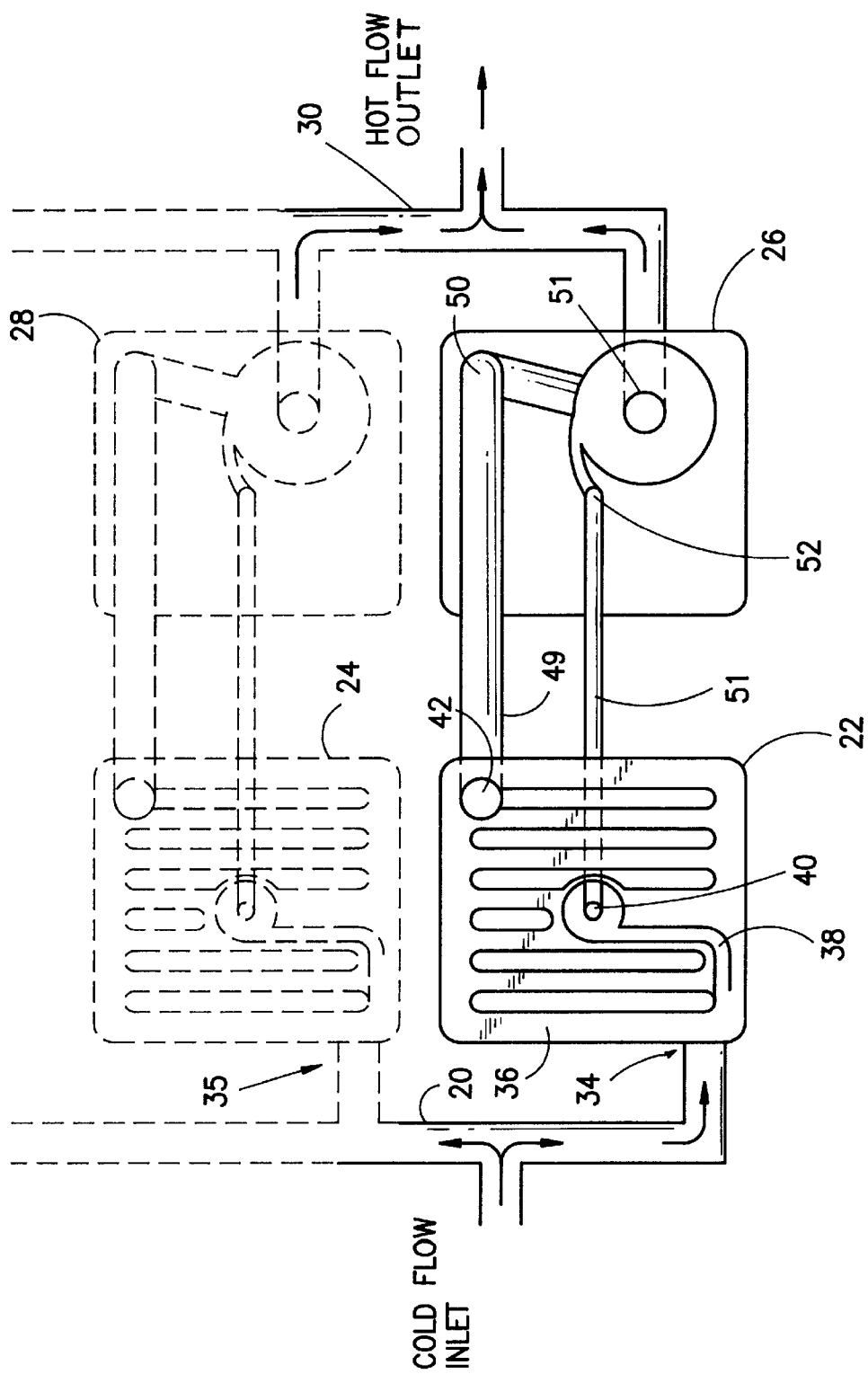
FIG. 2 is a partial schematic of a thermally managed liquid cooling module incorporating features of the present invention.

Referring to FIG. 2, cooling plate 22 includes an inlet 34 in fluid communication with distribution manifold 20. Coolant flowing in inlet 34 is directed into a primary cooling passage 36 and a secondary cooling passage 38. The flow of coolant in primary cooling passage 36 follows a circuitous path through cooling plate 22 absorbing thermal energy from cooling plate 22 until the coolant is discharged at outlet 42. Similarly, liquid coolant flowing through secondary cooling passage 38 absorbs thermal energy from cooling plate 22 until is discharged through control port 40. The flow of liquid coolant discharged through outlet 42 enters primary inlet 50 of flow regulator 26 via duct 49. The flow of liquid coolant discharged through control port 40 similarly enters control port 52 of flow regulator 26 via duct 51. As described more fully hereinafter, flow regulator 26 is preferably laminated directly onto cold plate 22 such that inlet 50 and control port 52 are immediately adjacent control port 40 and outlet 42. Accordingly, ducts 49 and 51 are shown schematically in FIG. 2 as tubular ducts for explanatory purposes only.

The distribution manifold 20 is provided with an additional outlet in fluid communication with inlet 35 of an additional cooling plate 24. Flow of coolant 14 through cooling plate 24 is regulated by an additional flow regulator 28. In this embodiment, a substantially equal pressure exists at inlet 34 and inlet 35, such that coolant 14 in manifold 20 flows in parallel paths either through cooling plate 22 or cooling plate 24. In the preferred embodiment, additional cooling plates with associated flow regulators (not shown) are connected between distribution manifold 20 and collection manifold 30 to provide cooling for additional components. However, if there is only single cooling plate than a bypass between distribution manifold 20 and collection manifold 30 needs to be provided. During operation cooling liquid is constantly flowing through the cooling module 10 and through each of the cooling plates. The flow rate of the cooling liquid is selected, in a manner familiar to those skilled in the art, for the average thermal load of all the cooling plates in the cooling module 10. This operating condition is referred to as the design point. For a typical design point, the flow through control port 40 is in the range of 5 to 25 percent of the flow through outlet 42, with 15 percent being preferred.

Figure 3:
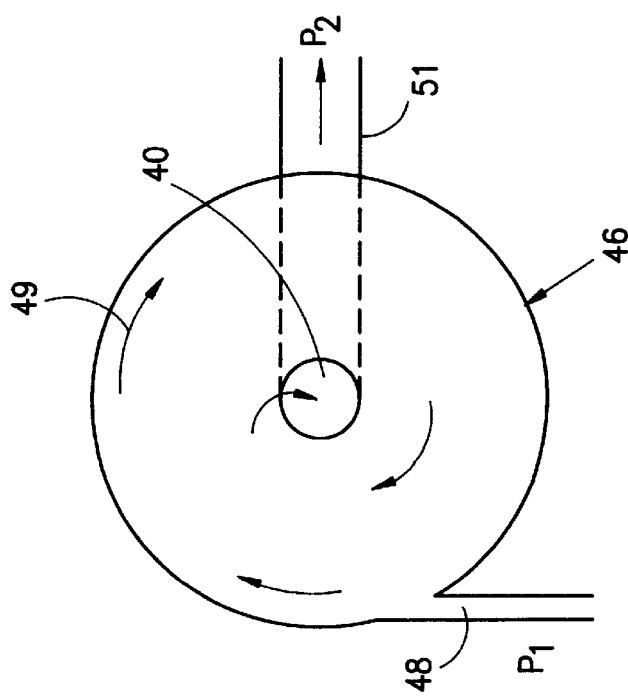
FIG. 3 is a schematic view of a vortex sensor suitable for use in conjunction with the thermally managed liquid cooling module of FIGS. 1 and 2.

Immediately upstream of control port 40 of cooling plate 22 is a fluidic vortex orifice 46. As shown in FIG. 3, as cooling fluid enters through tangential port 48, it flows in a generally circumferential, spiral path 49 and is discharged axially through control port 40 and into duct 51. As the flow rate increases, the circumferential component of the flow increases thereby generating an increasing radial pressure gradient. As the radial pressure gradient increases, resistance to flow through the control port 40 increases.

As cooling plate 22 warms, the temperature of the liquid coolant 14 rises and its viscosity decreases. As the viscosity decreases the flow rate through primary cooling passage 36 and secondary cooling passage 38 tends to increase, because there is less viscous drag and, therefore, less pressure drop along the flow path. Absent other considerations, this decrease in viscosity would simply result in an equal increased output at both outlet 42 and control port 40. However, the vortex orifice 46 attenuates the flow through control port 40 relative to the flow at outlet 42 due to the increasing radial pressure gradient in vortex orifice 46 caused by the increased flow. That is the increase in flow at control port 40 is less than the increase in flow at outlet 42. The resulting differential flow (and pressure) between control port 40 and outlet 42 is therefore a function of the cooling plate temperature, and may be used as a control signal to a fluidic amplifier adapted to increase or decrease the flow of coolant through the cooling plate.

Figure 4:
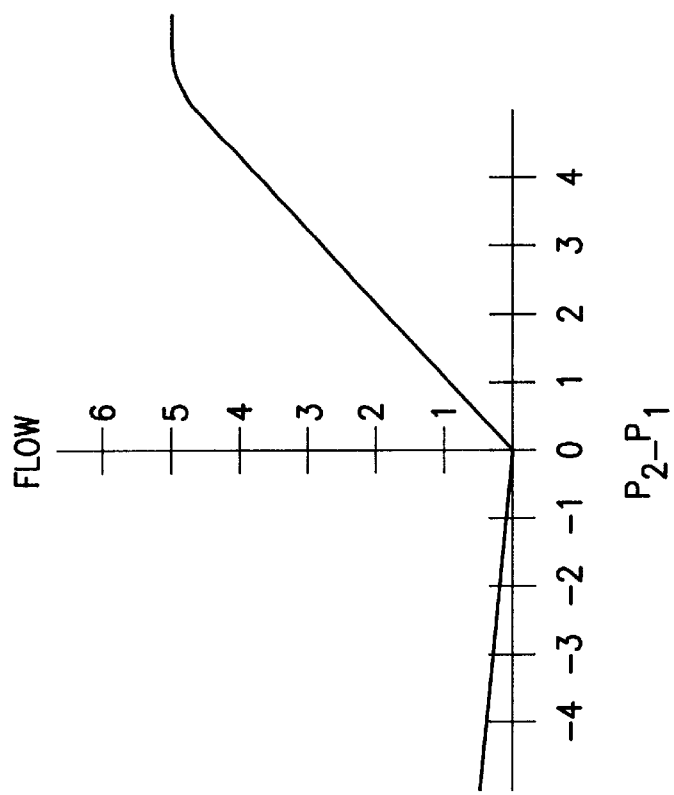
FIG. 4 is a schematic view of a vortex amplifier suitable for use in conjunction with the thermally managed liquid cooling module of FIGS. 1 and 2.
Figure 5:
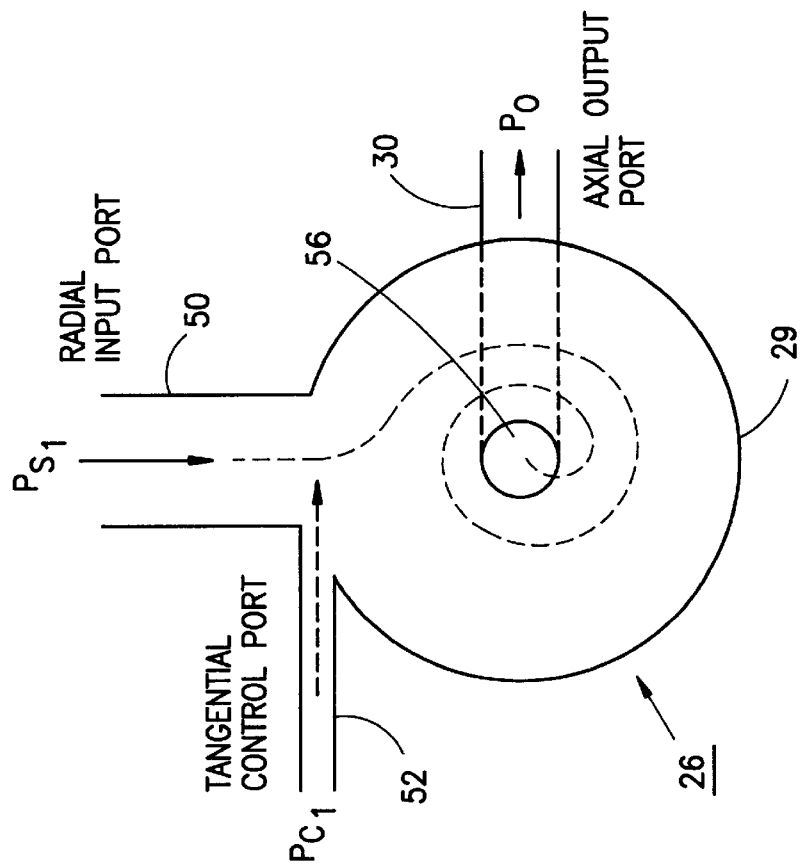
FIG. 5 is a graphical representation of the gain characteristics of the vortex amplifier of FIG. 6.

With reference to FIG. 4 and FIG. 5, flow regulator 26 comprises a fluidic vortex amplifier 29 having primary radial inlet port 50 and a tangential control port 52. Fluid entering primary inlet port 50 and control port 52 is discharged through regulator exhaust or output port 56. FIG. 5 is illustrative of the input-output characteristics of vortex amplifier 29. At the design point, the control port pressure $P_c$, the inlet port pressure $P_s$, and output port pressure $P_o$, are selected so that the amplifier ratio $(P_c-P_o)/(P_s-P_o)$ is between 1.1 and 1.3. As can be seen from the characteristic curve, in this range a small change in $P_c$ relative to $P_s$ results in a large change in output flow and hence flow through input port 50. Thus, a small change in the flow in control port 52 is amplified to produce a relatively large change in flow in inlet port 50. Where additional amplification is required, multiple stage vortex amplifiers may be used, with the output of one amplifier used as the control signal for the next stage.

With reference to FIG. 2, operation of a cooling module 10 is as follows. At the design point, the flow through control port 40 is preferably 15 percent of the flow through outlet 42. An increase in thermal load causes one of the cooling plates, in this case cooling plate 22 to warm. As cooling plate 22 warms, the temperature of the liquid coolant 14 rises and its viscosity decreases. As previously described, the vortex orifice 46 attenuates the flow through control port 40 so that the flow through control port 40 may now only be 10 percent of the flow through outlet 42. Because pressure is proportional to flow, the increase in $P_s$ is greater than the increase in PC so that the amplifier ratio decreases permitting increased flow through input port 50. By analogy, the effect described here is equivalent to opening a valve if a valve was used in place of flow regulator 26. As the restriction to the flow through input port 50, is relatively less that the design point restriction at the other flow regulators in the system, more cooling flow is directed from the manifold, across cooling plate and through input port 50. This increased flow provides extra cooling of the plate 22. As the cooling plate 22 cools, viscosity increases, and the process operates in reverse until the module 10 returns to equilibrium at the design point. Accordingly, the foregoing combination of vortex sensor 46 and vortex amplifier 26 results in a liquid cooling module cold plate temperature regulator having no moving parts.

It should be noted that distribution manifold 20 may be sized in order to have an insignificant pressure drop, such that the pressure at inlet 34 of cooling plate 22 is substantially equal to the pressure at inlet 35 of cooling plate 24, or the inlets of any other cooling plates in the system (not shown). This permits the rate of flow of coolant through cooling plate 22 to be regulated substantially exclusively by flow regulator 26.

Figure 6:
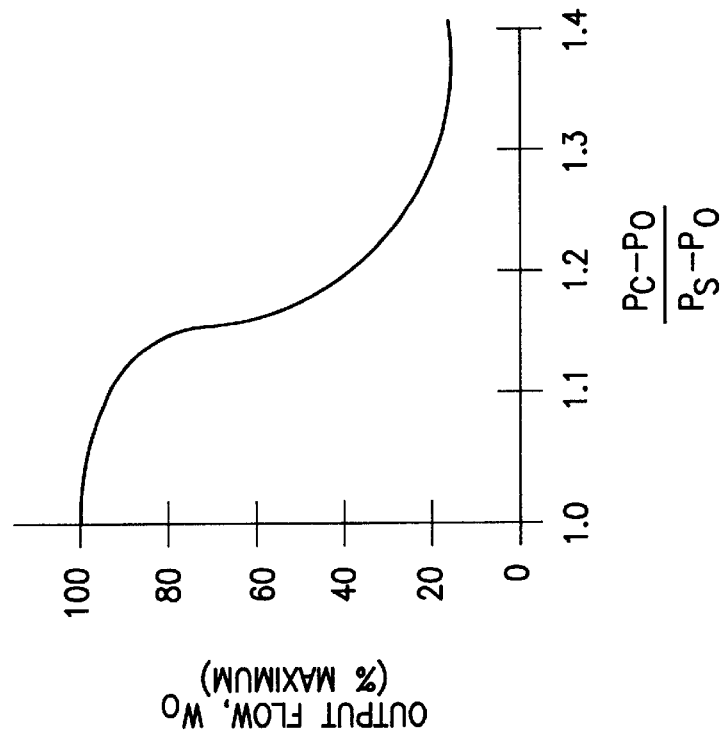
FIG. 6 is a depiction of a laminated fluidic module incorporating features of the present invention.

In a preferred embodiment, flow regulator 26 is laminated directly to cooling plate 22 to form a self-regulating cooling plate module. With reference to FIG. 6, cooling plate 22, flow regulator 26, distribution manifold 20, collection manifold 30 and other components of the fluidic circuit are preferably constant cross-section features, which permit machining each component from thin sheets of stainless steel, titanium, inconel, or refractory metal having good thermal conductivity. These individual metal laminates 62, 64, 66, 68, 70 and 72 each contain two dimensional features which, when stacked together define the desired flow path. Individual layers in the laminated module communicate through feed through holes 74 strategically located in each laminate. The individual metal laminates 62–72 are preferably plated or diffusion coated, then furnace bonded to form a solid hermetic laminated stack, which may then be placed against, bonded to, or otherwise oriented adjacent electronic component 8 (not shown) or other component be cooled. Preferably the machining operations are conducted using electron discharge machining (EDM) or conventional photolithography techniques common in the electronics industry. As shown in FIG. 7, in a preferred embodiment, distribution manifold 20 and collection manifold 30 (not shown) each comprise a laminate in a relatively larger cross-section module 76, having relatively smaller laminated cooling modules 90, 92, 94, 96, 98, and 100. Feed-through holes 74 (not shown) permit manifolds 20 and 30 to communicate with inlet 34 and outlet 51, inlet 34' and outlet 51' inlet 34''' and outlet 51''' and each successive inlet and outlet of each cooling plate module, to enable each cooling plate module 90–100 to independently regulate coolant flow therethrough. As shown in FIG. 8, each laminated stack comprising a cooling plate 22 may be individually adjusted for thickness to enable a single large module 76 to simultaneously cool multiple components of varying heights.

Although certain preferred embodiments and methods have been disclosed herein, it will be apparent from the foregoing disclosure to those skilled in the art that variations and modifications of such embodiments and methods may be made without departing from the true spirit and scope of the invention. Accordingly, it is intended that the invention shall be limited only to the extent required by the appended claims and the rules and principles of applicable law.

What is claimed is:

1. A feedback-controlled liquid cooling module comprising:
   a source of pressure for urging a flow of a liquid coolant;
   a first cooling plate in fluid communication with said pressure source and conducting heat away from a heat producing component, said first cooling plate defining an inlet, an outlet and a cooling passage for conveying said flow of liquid coolant between said inlet and said outlet;
   a thermally sensitive fluidic element in fluid communication with said cooling passage, for providing a fluidic control signal responsive to temperature of said liquid coolant;
   a fluidic amplifier in fluid communication with said first cooling plate, said fluidic amplifier regulating said flow of liquid coolant through said first cooling plate in response to said fluidic control signal.

2. The liquid cooling module of claim 1, wherein:
   said thermally sensitive fluidic element comprises a fluidic vortex diode.

3. The liquid cooling module of claim 1, wherein:
   said fluidic amplifier comprises a fluidic vortex amplifier.

4. The liquid cooling module of claim 1, further including:
   a heat exchanger in fluid communication with said first cooling plate for conveying heat from said liquid coolant.

5. The liquid cooling module of claim 1, wherein:
   said source of pressure comprises a positive displacement pump.

6. The liquid cooling module of claim 1, further including a second cooling plate in fluid communication with said pressure source conducting heat away from an electronic component, said second cooling plate defining a second inlet, a second outlet and a second cooling passage for conveying a portion of said flow of liquid coolant between said second inlet and said second outlet;
   a second thermally sensitive fluidic element in fluid communication with said cooling passage, for providing a fluidic control signal responsive to temperature of said liquid coolant;
   a second fluidic amplifier in fluid communication with said second cooling plate, said second fluidic amplifier regulating said flow of liquid coolant through said second cooling plate in response to said fluidic control signal;
   whereby said flow of liquid coolant is distributed between said first cooling plate and said second cooling plate responsive to differential temperature between said first and second cooling plate.

7. A closed-loop liquid cooling module comprising:
   a source of pressure for urging a flow of a liquid coolant;
   cooling plate having a coolant passage therethrough;
   a cooling plate;
   a passive feedback-controlled regulator; and
   ducting to provide a closed-loop liquid coolant pathway;
   said passive feedback-controlled regular comprising;
      a fluidic vortex sensor in fluid communication with said coolant passage, said fluidic vortex sensor providing a fluidic control signal responsive to temperature of said liquid coolant;
      a fluidic amplifier regulating said flow of liquid coolant in said closed-loop liquid coolant pathway in response to said fluidic control signal.

8. The liquid cooling module of claim 7, wherein:
   said fluidic amplifier is a fluidic vortex amplifier.

9. The liquid cooling module of claim 7, wherein:
   said cooling plate, said vortex sensor and said fluidic amplifier are constructed of individual metal laminae bonded together to form an hermetic module.

10. A liquid cooled electronic module comprising:
    a heat producing electronic component;
    a source of pressure for urging a flow of a liquid coolant;
    a first cooling plate in fluid communication with said pressure source and adapted for conducting heat away from said heat producing electronic component, said first cooling plate defining an inlet, an outlet and a cooling passage for conveying said flow of liquid coolant between said inlet and said outlet;
    a thermally sensitive fluidic element in fluid communication with said cooling passage, for providing a fluidic control signal responsive to temperature of said liquid coolant;
    a fluidic amplifier in fluid communication with said first cooling plate, said fluidic amplifier regulating said flow of liquid coolant through said first cooling plate in response to said fluidic control signal.

* * * * *

UNITED STATES PATENT AND TRADEMARK OFFICE
CERTIFICATE OF CORRECTION

PATENT NO. : 5,815,370
DATED : September 29, 1998
INVENTOR(S) : Trevor G. Sutton It is certified that error appears in the above-identified patent and that said Letters Patent is hereby corrected as shown below:

On the title page, item[73] insert should read:

Assignees: AlliedSignal Inc., Morristown, New Jersey, USA

Signed and Sealed this

Thirteenth Day of July, 1999

Attest:

Attesting Officer

Q. TODD DICKINSON

Acting Commissioner of Patents and Trademarks